(12) United States Patent
Cheon et al.

(10) Patent No.: US 8,941,293 B2
(45) Date of Patent: Jan. 27, 2015

(54) SOLID STATE LIGHTING DEVICES COMPRISING QUANTUM DOTS

(75) Inventors: Kwang-Ohk Cheon, Latham, NY (US); Jennifer Gillies, Petersburg, NY (US); David Socha, Delmar, NY (US); David Duncan, Troy, NY (US); Michael Locasio, Clifton Park, NY (US)

(73) Assignee: Samsung Electronics Co., Ltd. (KR)

( * ) Notice: Subject to any disclaimer, the term of this patent is extended or adjusted under 35 U.S.C. 154(b) by 723 days.

(21) Appl. No.: 13/016,295

(22) Filed: Jan. 28, 2011

(65) Prior Publication Data

US 2012/0195340 A1 Aug. 2, 2012

Related U.S. Application Data

(63) Continuation of application No. 11/747,701, filed on May 11, 2007, now abandoned.

(60) Provisional application No. 60/799,311, filed on May 11, 2006.

(51) Int. Cl.
| | |
|---|---|
| *H01J 1/62* | (2006.01) |
| *H01L 33/50* | (2010.01) |
| *B82Y 20/00* | (2011.01) |

(52) U.S. Cl.
CPC ............ *H01L 33/502* (2013.01); *H01L 33/501* (2013.01); *B82Y 20/00* (2013.01)
USPC .......................................... 313/501; 313/498

(58) Field of Classification Search
None
See application file for complete search history.

(56) References Cited

U.S. PATENT DOCUMENTS

| | | | |
|---|---|---|---|
| 5,426,014 A | 6/1995 | Kelly et al. | |
| 5,821,305 A | 10/1998 | Schutyser et al. | |
| 6,682,872 B2 | 1/2004 | Sachdev et al. | |
| 6,803,719 B1 | 10/2004 | Miller et al. | |
| 7,083,490 B2 * | 8/2006 | Mueller et al. | 445/24 |
| 2007/0001182 A1 | 1/2007 | Schardt et al. | |
| 2007/0104972 A1 | 5/2007 | Shinohara et al. | |
| 2008/0173886 A1 * | 7/2008 | Cheon et al. | 257/98 |

OTHER PUBLICATIONS

U.S. Appl. No. 11/747,701, filed May 11, 2007, Office Action dated Jul. 30, 2010.
U.S. Appl. No. 11/747,701, filed May 11, 2007, Response to Restriction Requirement filed Jun. 1, 2010.
U.S. Appl. No. 11/747,701, filed May 11, 2007, Restriction Requirement dated Mar. 31, 2010.
U.S. Appl. No. 11/747,701, filed May 11, 2007, Response to Restriction Requirement filed Feb. 22, 2010.
U.S. Appl. No. 11/747,701, filed May 11, 2007, Restriction Requirement dated Jan. 22, 2010.
Rohwer et al., "Development of Solid State Light Sources Based on II-IV Semiconductor Quantum Dots", Light Emitting Diodes: Research, Manufacturing, and Application VII, SPIE, 2004.

* cited by examiner

*Primary Examiner* — Britt D Hanley
(74) *Attorney, Agent, or Firm* — Cantor Colburn LLP

(57) ABSTRACT

Solid state lighting devices containing quantum dots dispersed in polymeric or silicone acrylates and deposited over a light source. Solid state lighting devices with different populations of quantum dots either dispersed in matrix materials or not are also provided. Also provided are solid state lighting devices with non-absorbing light scattering dielectric particles dispersed in a matrix material containing quantum dots and deposited over a light source. Methods of manufacturing solid state lighting devices containing quantum dots are also provided.

34 Claims, 15 Drawing Sheets

US 8,941,293 B2

SOLID STATE LIGHTING DEVICES COMPRISING QUANTUM DOTS

CROSS-REFERENCE TO RELATED APPLICATIONS

The present application claims priority to and is a continuation of U.S. patent application Ser. No. 11/747,701, filed on May 11, 2007, which claims priority to U.S. Provisional Application Ser. No. 60/799,311, filed on May 11, 2006, which is incorporated by reference herein.

FIELD OF THE INVENTION

The present invention relates to solid state lighting devices comprising quantum dots. The present invention also relates to methods of making solid state lighting devices comprising quantum dots.

BACKGROUND OF THE INVENTION

Light emitting diodes (LEDs) are solid state semiconductor devices that emit light with a narrow spectral distribution when an electric current is applied. The wavelength of light emitted by the LEDs is a direct result of the bandgap of the emissive layer comprising the quantum dot which is, in turn, related to the semiconductor composition.

High brightness blue (peak wavelength between 450 nm and 470 nm), violet (peak wavelength ~410 nm) and ultraviolet LEDs (peak wavelength ~380 nm) have improved in terms of both brightness, efficiency, and longevity. Green indium gallium nitride (InGaN) LEDs (peak wavelength ~520 nm) are also available, however, the efficiency of LEDs made of this material system drops precipitously for wavelengths approaching 555 nm green.

The first and most common method to achieve white light from an LED is to combine a phosphor powder with an epoxy or silicone encapsulant and apply the mixture onto the surface of an InGaN LED chip or within a reflector cup containing a blue InGaN LED chip. The phosphor absorbs a portion of the blue light emitted by the underlying LED chip and down converts that light to a slightly longer broadband yellow wavelength. At the appropriate phosphor combination, the ratio of broadband yellow light plus the residual blue light derived from the LED chip that is not absorbed by the phosphor yields a white color. See Schotter P., "Luminescence Conversion of Blue Light Emitting Diodes," *App. Phys. A.*, Vol. 64, pgs. 417-418 (1997). Similarly, other specialty colors such as pink can be made by adding "red" emitting phosphors to a blue emitting LED chip. Lanthanide doped garnets, nitrides and orthosilicates are the most widely used types of phosphors for LED application. Exemplary broadband yellow phosphors used to create white light include cerium doped yttrium aluminum garnet (Ce:YAG) or cerium doped terbium aluminum garnet (Ce:TAG). A typical emission spectrum of the white light LEDs, prepared by combining the YAG phosphor with a blue light, has two distinct peaks, where the first peak corresponds to blue LED emission, ~470 nm, and the second peak corresponds to the emission of the YAG phosphor, ~555 nm. Generally speaking, white light made in this way is of poor color quality (low color rendering index-CRI) and can reach a limited range of white color temperatures (typically 6500-4500K). Phosphors generally have a fairly narrow absorption spectra and as such can only be used on underlying light sources having a very specific range of emission wavelengths. The Ce:YAG is optimized for 460 nm light but is poorly suited for LED chips emitting at any other wavelength.

High brightness LEDs including white and specialty color LEDs have diverse applications including traffic signals, signage and display lighting, architectural lighting, LCD display backlights used in mobile phones and PDAs, larger flat panel LCD backlights and projectors/projection TV, outdoor/landscape lighting luminaires, interior illumination in the transportation sector (airplanes, subways, ships, etc.), and automobiles. As such there is a need for bright long lasting LEDs available in a wide variety of colors.

Quantum dots (also known as semiconductor nanocrystals) can be used as down converters applied onto short wavelength LED chips and used to generate the visible and infrared light. Quantum dots are tiny crystals of II-VI, III-V, IV-VI materials that have a diameter between 1 nanometer (nm) and 20 nm. In the strong confinement limit, the physical diameter of the quantum dot is smaller than the bulk excitation Bohr radius causing quantum confinement effects to predominate. In this regime, the quantum dot is a 0-dimensional system that has both quantized density and energy of electronic states where the energy differences between electronic states are a function of both the quantum dot composition and the physical size of the quantum dot itself. Larger quantum dots have more closely-spaced energy states and smaller quantum dots have the reverse. Because interaction of light and matter is determined by the density and energy of electronic states, many of the optical and electric (optoelectronic) properties of quantum dots can be tuned or altered simply by changing the quantum dot geometry (i.e. physical size).

Single quantum dots or monodisperse populations of quantum dots exhibit unique optical properties that are size tunable. Both the onset of absorption and the photoluminescent wavelength are a function of quantum dot size and composition. The quantum dots will absorb all wavelengths shorter than the absorption onset, however photoluminescence will always occur at the absorption onset. The bandwidth of the photoluminescent spectra is due to both homogeneous and inhomogeneous broadening mechanisms. Homogeneous mechanisms include temperature dependent Doppler broadening and broadening due to the Heisenberg Uncertainty Principle, while inhomogeneous broadening is due to the size distribution of the quantum dots. The narrower the size distribution of the quantum dots, the narrower the full-width half-max (FWHM) of the resultant photoluminescent spectra. In 1991, Louis Eugene Brus wrote a paper reviewing the theoretical and experimental research conducted on colloidally grown quantum dots, such as cadmium selenide (CdSe) in particular (Brus L., *Quantum Crystallites and Nonlinear Optics, Applied Physics A,* 53 (1991)). That research, precipitated in the early 1980's by the likes of Efros, Ekimov, and Brus himself, greatly accelerated by the end of that decade as demonstrated by the increase in the number of papers concerning colloidally grown quantum dots.

For a given quantum dot, the emission band is dependant on the size of the quantum dot. For instance, CdSe covers the whole visible range: the 2 nm diameter CdSe quantum dot emits in the blue range and 10 nm CdSe emits in the red range.

Therefore quantum dots are useful as a novel optical down converter that, when combined with a light emitting diode light source, could produce a range of colors that are unattainable with conventional phosphors. One of the challenges to date, however, is that quantum dots are susceptible to degradation when dispersed in many polymeric materials that results in degradation of brightness. Quantum dots are also susceptible to photo-oxidation which results in permanent degradation of brightness over time when exposed to oxygen and light. Furthermore, quantum dot brightness is also reduced at elevated temperatures such as those found on the surfaces of LED chips. Lastly, the process by which quantum dots are applied to LED chips should be compatible with contemporary manufacturing processes.

Until now there were several manners in which to apply quantum dots as down converters. Bawendi et al. has demonstrated that nanocrystals may be dispersed within polystyrene solution and applied to the surface of an LED. However, this method requires that the solvent in which the polystyrene and nanocrystals are dispersed be evaporated which is incompatible with conventional manufacturing processes. This may also result in a porous nanocrystal composite that does not protect the nanocrystals from oxygen and thus enables photo-oxidative degeneration of the nanocrystals. Furthermore, polystyrene is subject to degradation (yellowing) itself under the intense light of an LED chip. Bawendi et al. also demonstrated that nanocrystals in various solvents may be added to methacrylate monomers or epoxies which react to for a polymeric solid. However again, the use of solvents results in porous films and subject the nanocrystals to photo-oxidative degradation. Those methods are also incompatible with conventional LED manufacturing processes. Rohwer et al. demonstrated white light LEDs comprising a "blue" InGaN LED chip upon which CdS nanocrystals were dispersed. The CdS nanocrystals were prepared in such a way that there existed a prevalence of defects on the nanocrystal surface that result in well known broadband surface trap emission. This light emission mechanism is inefficient and results in low efficacy LEDs. See U.S. Pat. No. 6,914,265, U.S. Pat. No. 6,890,777, U.S. Pat. No. 6,803,719, U.S. Pat. No. 6,501,091 and Rohwer L., "Development of Solid State Lighting Devices Based on II-VI Semiconductor Quantum Dots," Proc. of the SPIE, Vol. 5366 pages 66-74.

As such, there is a need in the art for a solid state lighting devices that do degrade under the intense illumination of the underlying light source, are compatible with conventional LED packaging methodologies, do not degrade the brightness of the quantum dots and/or protect the quantum dots from photo-oxidation.

SUMMARY OF THE INVENTION

The present invention provides solid state lighting devices, methods of making the same, and apparatuses comprising solid state lighting devices.

In an embodiment, the present invention provides a solid state lighting device comprising a light source and an active layer deposited either directly or indirectly on the light source. The active layer comprises a population of quantum dots dispersed in a first matrix material, wherein the first matrix material comprises a polymer or silicone having a plurality of cross-linked acrylate groups. In certain embodiments, an encapsulant layer is disposed between the light source and the active layer. In additional or alternative embodiments, another encapsulant layer is disposed on top of the active layer.

In other embodiments, the present invention provides a solid state lighting device comprising a light source and an active layer deposited either directly or indirectly on the light source. The active layer comprises a first matrix material and a population of quantum dots dispersed in the first matrix material. The active layer further comprises non-absorbing light scattering dielectric particles dispersed in the first matrix material. The particles have a diameter between about 2 nanometers and 50 microns, have refractive indices greater than that of the first matrix material, and are substantially non-absorbent to light emitted by the light source or the population of quantum dots.

In other embodiments, the present invention provides a method of manufacturing a solid state light emitting device comprising providing a light source, dispersing quantum dots in a polymer or silicone having acrylate groups to form a first matrix material and depositing the first matrix material either directly or indirectly on the light source. The method further comprises cross-linking the acrylate groups in the first matrix material to form a solid active layer. The acrylate groups can be cross-linked by various methods including, for example, by chemical additives, ultraviolet radiation, an electron beam or heat.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
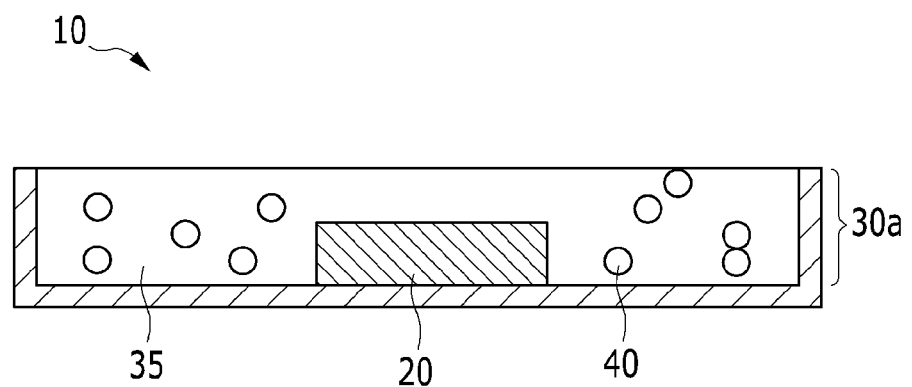
FIG. 1 is a schematic illustration of a solid state lighting device according to an embodiment of the present invention.

In certain embodiments, the present invention provides solid state lighting devices. Referring to FIG. 1, in certain embodiments, the present invention provides a solid state lighting device 10 comprising a light source 20 and an active layer 30 deposited directly on the light source 20. Active layer 30 comprises a first matrix material 35 comprising a polymer or silicone having a plurality of cross-linked acrylate groups. Dispersed within first matrix material 35 are one or more populations of quantum dots 40. The above-mentioned polymers and silicones have been found to substantially maintain the initial quantum yield of the quantum dots, degrade very slowly when exposed to intense light derived from the light source, protect the quantum dots from photo-oxidation and may be applied to the light source using conventional solid state lighting device packaging methodologies. The first matrix material is preferably transparent to both the wavelength of light emitted by the underlying light source as well as the light wavelength(s) emitted by each population of quantum dots dispersed within it. Non-limiting examples of acrylated polymers and silicones include urethane acrylate, polyacrylate, acrylated silicone, urethane acrylate epoxy mixture, or a combination thereof. Particularly preferred acrylated polymers or silicones are OP-54™ (Dymax) and ZIPCONE™ (Gelest).

Each population of quantum dots dispersed within the first matrix material absorbs a portion of the light emitted by the underlying light source and emits light at a longer wavelength, where the peak emission wavelength of each quantum dot population is dependent upon the composition and mean diameters of the quantum dots themselves. Each population of quantum dots is composed of a plurality of similar quantum dots in both composition and size. The quantum dots comprise a quantum dot core having an outer surface. The quantum dot core may be spherical nanoscale crystalline materials (although oblate and oblique spheroids can be grown as well as rods and other shapes) having a diameter of less than the Bohr radius for a given material and typically but not exclusively comprises II-IV, III-V, and IV-VI binary semiconductors. Non-limiting examples of the semiconductor materials that the quantum dot core may comprise include ZnS, ZnSe, ZnTe, CdS, CdSe, CdTe, HgS, HgSe, HgTe (II-VI materials), PbS, PbSe, PbTe (IV-VI materials), AlN, AlP, AlAs, AlSb, GaN, GaP, GaAs, GaSb, InN, InP, InAs, InSb (III-V materials). In addition to binary semiconductors, the quantum dot core may comprise ternary, quaternary, or quintary semiconductor materials. Non-limiting examples of ternary, quaternary, or quintary semiconductor materials include $A_xB_yC_zD_wE_{2v}$ wherein A and/or B may comprise a group I and/or VII element, and C and D may comprise a group III, II and/or V element although C and D are not group V elements, and E may comprise a VI element, and x, y, z, w, and v are molar fractions between 0 and 1.

In addition to the quantum dot core having an outer surface, the quantum dot composition may comprise a shell formed on the outer surface of the core. The shell is typically, although not always, between 0.1 nm and 10 nm thick. The shell may provide for a type A quantum dot composition. Shells may comprise various different semiconductor materials such as, for example, CdSe, CdS, CdTe, ZnS, ZnSe, ZnTe, HgS, HgSe, HgTe, InP, InAs, InSb, InN, GaN, GaP, GaAs, GaSb, PbSe, PbS, and PbTe. The shell may be formed directly on the outer surface of the core or over one or more intermediate layers, such as the metal layer described below, formed on the outer surface of the core.

In an alternate embodiment, the quantum dot composition may comprise the quantum dot core having an outer surface and one or more metal layers formed on the outer surface of the core after synthesis of the core. The metal layer may act to passivate the outer surface of the quantum dot core and limit the diffusion rate of oxygen molecules to the core. The metal layer is typically, although not always, between 0.1 nm and 5 nm thick. The metal layer may include any number, type, combination, and arrangement of metals. For example, the metal layer may be simply a monolayer of metals formed on the outer surface of the core or multiple layers of metals formed on the outer surface. The metal layer may also include different types of metals arranged, for example, in alternating fashion. Further, the metal layer may encapsulate the quantum dot core or may be formed on only parts of the outer surface of the core. The metal layer may include the metal from which the quantum dot core is made either alone or in addition to another metal. Non-limiting examples of metals that may be used as part of the metal layer include Cd, Zn, Hg, Pb, Al, Ga, or In.

In another alternate embodiment, the quantum dot composition may comprise the quantum dot core having an outer surface, one or more metal layers formed on the outer surface of the core after synthesis of the core, and the shell overcoating the metal layer(s).

The quantum dot core, shell, and/or metal layer may be grown by the pyrolysis of organometallic precursors in a chelating ligand solution or by an exchange reaction using the prerequisite salts in a chelating ligand solution. The chelating ligands are typically lyophilic and have a moiety with an affinity for the outer layer of the quantum dot composition and another moiety with an affinity toward the solvent, which is usually hydrophobic. Typical examples of chelating ligands include lyophilic surfactant molecules such as Trioctylphosphine oxide (TOPO), Trioctylphosphine (TOP), Tributylphosphine (TBP), primary amines, and organic acids. The ligands used throughout the quantum dot synthesis remain on the surface of the quantum dots after the quantum dots are removed from the reaction mixture. Thus the ligands used during synthesis comprise the surfactant layer. Though the surfactant molecules may include a phosphine moiety, it is to be appreciated that other chelating ligands may be used.

The surfactant layer of the quantum dot complex typically includes organic molecules that have a moiety with an affinity for the surface of the quantum dot and another hydrophobic moiety (typically alkane, aromatic or other nonpolar or non-ionizable moiety, e.g., TOP is terminated with three nonpolar octane groups) with an affinity for a hydrophobic solvent. Moieties that have an affinity to the surface of the quantum dot include thiols, amines, phosphines, and phosphine oxides. Surfactants, such as TOPO, TOP, and TBP, are typically used in the synthesis of the quantum dots and can remain on the dot's surface after preparation of the dot or may be added or replaced by other surfactants after synthesis. The surfactant layer tends to assemble into a coating around the quantum dot and enables the dot to suspend in a hydrophobic solvent.

In another embodiment of the invention, the active layer of a solid state light emitting device includes conventional phosphors that are added with the quantum dots to the first matrix material. Non-limiting examples of conventional phosphors include cesium yttrium aluminum garnet, europium yttrium aluminum garnet, europium orthosilicates, cesium terbium aluminum garnet, and europium nitrides.

Figure 1A:
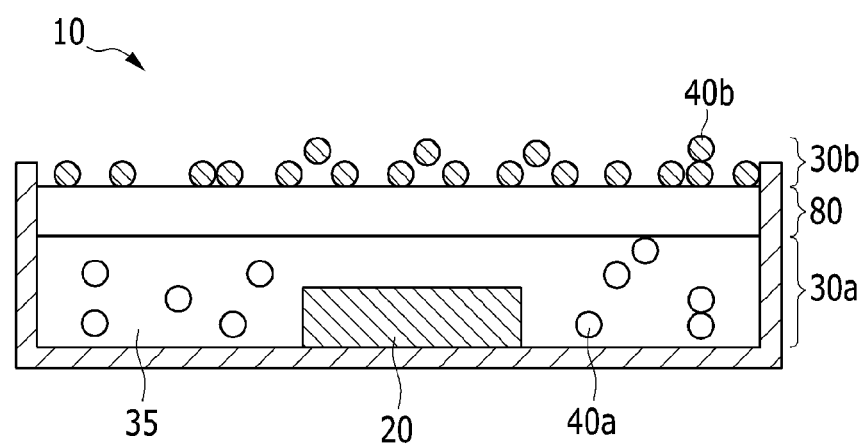
FIG. 1a is a schematic illustration of a solid state lighting device according to another embodiment of the present invention.

It is appreciated that although FIG. 1 (and other figures described below) shows the active layer as one single layer, it may comprise more than one layer. Further, in certain embodiments, a population of quantum dots are not dispersed in any matrix material but rather directly deposited on the underlying layer of light source. For example, referring to FIG. 1a, in certain embodiments, a solid state lighting device 10 comprises a first active layer 30a with a first population of quantum dots and a second active layer 30b with a second population of different quantum dots disposed on top of first active layer 30a. In certain embodiments, the second population of different quantum dots are not dispersed in a matrix material, whereas the first population may be as illustrated in FIG. 1a. In other embodiments, a spacer film 80 separates the first and second active layers. The spacer film can comprise any suitable material such as a polymeric or silicone material. In certain embodiments, the spacer film is fabricated from polyacrylate.

Figure 2:
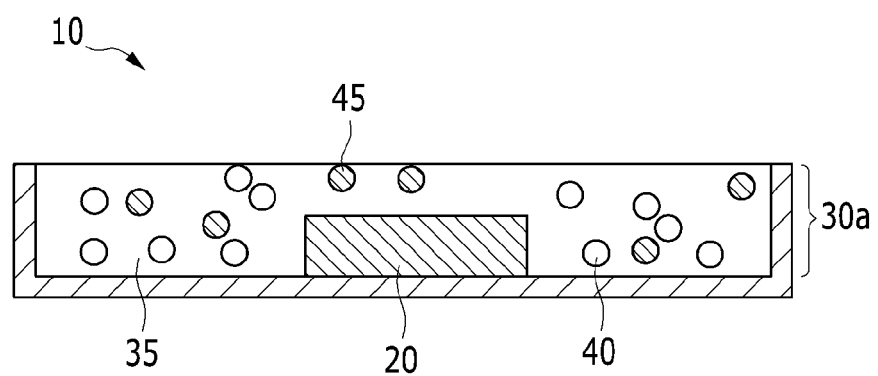
FIG. 2 is a schematic illustration of a solid state lighting device according to another embodiment of the present invention.

Referring to FIG. 2, in other embodiments, the present invention provides a solid state lighting device 10 comprising a light source 20 and an active layer 30 deposited directly on light source 20. Active layer 30 comprises a first matrix material 35 and a population of quantum dots 40. Active layer 30 further comprises light scattering dielectric particles 45 dispersed in first matrix material 35. The particles have a diameter between about 2 nanometers and 50 microns, have refractive indices greater than that of first matrix material 35, and are substantially non-absorbent to light emitted by light source 20 or the population of quantum dots 40. A purpose of these particles is to scatter the light emitted by the underlying light source as well as the quantum dots and cause the respective light to mix more evenly. For example, there may be a non-uniform angular color distribution where the observer would see more light from the underlying light source when viewing the solid state lighting device along its axis and a prevalence of the light emitted by the quantum dots when viewed from an off angle. For example, a solid state light emitting device composed of a "blue" emitting LED chip and "red" emitting quantum dots would appear bluer when viewed directly along the axis and redder when viewed off axis.

Non-limiting examples of light scattering dielectric particles include titania, alumina, and other metal oxides. In a preferred embodiment, the light scattering dielectric particles are titania particles with an average diameter of 5 nm, loaded at 1% by weight. Larger particles can be used as well, with some adjustment to the loading. These materials can be dispersed directly into the first matrix material prior to curing.

In another embodiment of the present invention, the active layer comprises a first matrix material and plurality of microparticles dispersed in the first matrix material. The microparticles further comprise one or more populations of quantum dots dispersed within a second transparent matrix material that has micron scale dimensions. Said second matrix material may be composed of sol-gel, polymers, silicones, polyurathatne acryalate, and other materials that do not degrade the luminosity of the quantum dots. The active layer may further comprise light scattering dielectric particles dispersed in the first matrix material. The dielectric particles may have average diameters ranging from 100 nm to 50 microns. A wide range of first matrix materials can be used, including sol-gel glasses, glass, polymers, and epoxy. In one embodiment, the quantum dot microparticles may be formed by dispersing the quantum dots into a suitable first matrix material, curing the material, and then milling the cured material to 0.20 microns to form the microparticles. In another embodiment, the quantum dot microparticles may be formed by absorbing the quantum dots onto the surface of fumed silica and then powdering the resulting quantum dot-silica composite to form the microparticles. The microparticles may then be mixed directly into an appropriate first matrix material, along with the dielectric particles.

Figure 3:
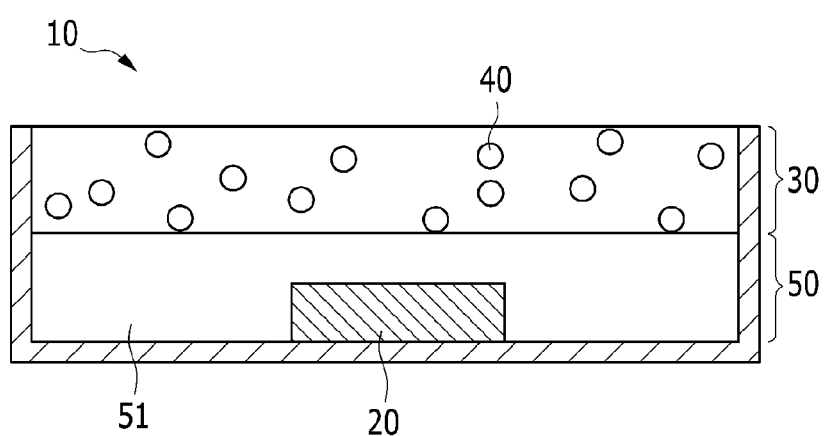
FIG. 3 is a schematic illustration of a solid state lighting device according to another embodiment of the present invention.

Referring to FIG. 3, in certain embodiments, a solid state lighting device 10 as described above or according to other embodiments of the present invention has an encapsulant layer 50 between active layer 30 and light source 20. Encapsulant layer 50 comprises a second matrix material 51, non-limiting examples of which are silicones, epoxies, acrylates, plastics and combinations thereof including a polyacrylate, an acrylated silicone, polyurethane acrylate, epoxy, silicone, sol-gel, nanoclay, or a combination thereof. Encapsulant layer 50 can prevent excessive heat generated by light source 20 from reaching the population of quantum dots, which could cause heat degradation. The second matrix material can be deposited on the light source and then cured by, for example, ultraviolet (UV) or thermal curing, solvent evaporation, or some other chemical reaction, such as a Michael reaction.

Figure 4:
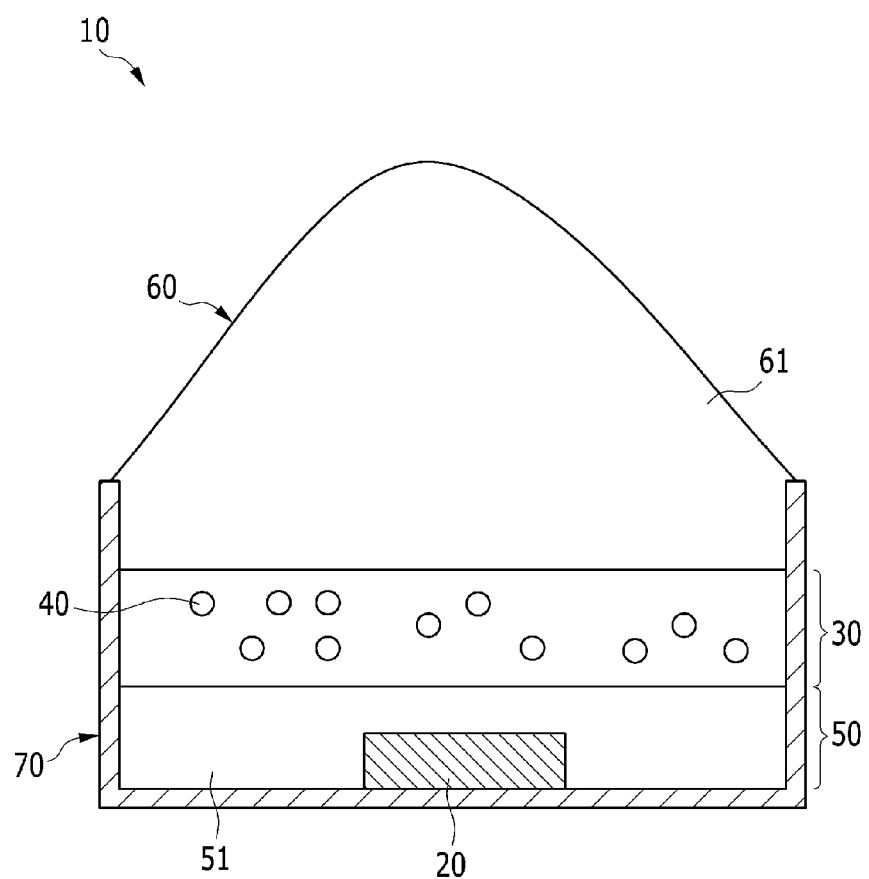
FIG. 4 is a schematic illustration of a solid state lighting device according to another embodiment of the present invention

Alternatively or in addition, referring to FIG. 4, in certain embodiments, a solid state lighting device 10 comprises another encapsulant layer 60 disposed on top of active layer 30. Another encapsulant layer 60 comprises a third matrix material 61 which can include the same non-limiting examples as described above with respect to encapsulant layer 50. Encapsulant layer 60 can prevent photo-oxidation of the population of quantum dots in active layer 30. Although FIG. 4 illustrates the deposit of both encapsulant layer 60 and encapsulant layer 50, it is understood that only encapsulant layer 50 or only encapsulant layer 60 can be employed. Further, although encapsulant layers 60 and 50 are shown as single layers, either or both can be applied as more than one layer. Further, other layers can be disposed between or one any of the active layer, encapsulant layer 50, and/or encapsulant layer 60.

As shown in FIG. 4, in certain embodiments, a solid state lighting device comprises a reflector cup 70 housing light source 20 and any of active layer 30, encapsulant layer 50, and encapsulant layer 60. Although reflector cup 70 is shown in many of FIGS. 1-4, it is understood that the figures only illustrate exemplary embodiments and other embodiments of the present invention include a solid state lighting device without a reflector cup. A reflector cup can cause the emitted light from the light source to reflect upwards so that sufficient amounts reach the population of quantum dots in the active layer and excite them.

The solid-state lighting devices of the present invention comprise a light source which may be, for example, an LED chip, a laser, white light, lamp or any other suitable combination thereof. Regarding LED chips, different light-emitting chips produce distinct colors where, the wavelength of the light emitted from the chip is dependant on the material bandgap and hence the semiconductor composition with which the light-emitting chip is made. Typically, visible emitting LED chips are made from gallium phosphide alloyed or doped with varying amounts of aluminum and indium (AlInGaP) or gallium nitride alloyed with varying amounts of indium (InGaN) to produce light emission wavelengths ranging from ~580 nm to ~680 nm (amber through deep red) and ~380 nm to 520 nm (UV through blue-green) respectively. Preferably, in solid state lighting devices of the present invention, the LED chip is selected such that it emits light at an energy that is capable of exciting the quantum dots present in the active layer. Typically, quantum dot complexes may be excited by wavelengths that are less than the emission wavelengths of the quantum dot. Alternative LED chip compositions may be used that emit light in different portions of the spectrum so long as the peak emission wavelength of the chip is shorter than the peak emission wavelength of the overlying quantum dots. For example, lead sulfide (PbS) emitting at 1550 nm in the infrared portion of the spectrum may be used in conjunction with GaAs, InGaAs, or other infrared emitted LEDs so long as they emit at wavelengths shorter than 1550 nm. In a preferred embodiment of the present invention, the light emitted from the LED chip is between 440 nm to 480 nm. Of course, other LED chips may be used including but not limited to 480-530 nm "green" emitting InGaN LEDs, 400-420 nm violet emitting InGaN LEDs, 380 nm UV emitting and other LED chips.

The solid state lighting devices of the present invention have several different applications. For example, the devices can be incorporated into traffic signals, signage and display lighting, architectural lighting, LCD display backlights used in mobile phones and PDAs, larger flat panel LCD backlights and projectors/projection TV, outdoor/landscape lighting luminaires, interior illumination in the transportation sector (airplanes, subways, ships, etc.), automobiles, and a number of other apparatuses.

The present invention also provides methods of manufacturing a solid state light emitting device comprising dispersing one or more population of quantum dots in a polymer or silicone having acrylate groups to form a first matrix material, depositing the first matrix material either directly or indirectly on a light source and cross-linking the acrylate groups in the first matrix material to form a solid active layer. Acrylate side chains have the general chemical formula of ($CH_2$=$CHCOO^-$), thus including vinyl groups attached to a carbonyl carbon. Quantum dots may be dispersed within a liquid monomer or oligomer of a polymer or silicone acrylate, dispensed onto the light source, and cross-linked to form a solid active layer. The quantum dots may be dispersed in the first matrix material with or without a solvent.

The cross-linking can be brought about, for example, by chemical additives, UV radiation, electron beam or heat. Typical cross-linking reactions can be the result of UV or thermal initiated vinylic addition, Michael addition, epoxidation, or condensation. Typical cross-linking reactions involve the reaction of the vinyl groups present on the polyacrylate side chains. In a Michael reaction, a cross-linking molecule reacts with the carbonyl carbons of the acrylate side chains on adjacent polymer oligomers. Nonlimiting examples of crosslinking agents used in a Michael reaction are amines, diamine, oleyl amine, dodecyl amine, aminopropylmethoxysilane, bis(3-aminopropyl)-tetramethyl disiloxane, 3-aminopropyl dimethyl ethoxysilane, 3-aimnopropylmethyl bis-(trimethyl siloxy)silane, and combinations thereof. The cross-linking reaction may be facilitated by adding thermal initiators and/or UV initiators followed by the application of heat or UV irradiation, respectively. An exemplary thermal initiator is azobisisobutyronitrile (AIBN) and an exemplary UV initiator is 1 hydroxy cyclohexyl phenyl ketone. In preferred embodiments, the curing dosage is approximately 0.6 Joule/$cm^2$ when utilizing UV curing.

In certain embodiments, 20% methyl hexahydrophthalic anhydride (MHHPA) is added to the first matrix material of the active layer. It has been found that the addition of 20% MHHPA to the polymer or silicone acrylate matrix facilitates the dispersal of quantum dots into the first matrix material and further improves operational longevity. It has also been found that epoxy may be added to the first matrix material applied to the light source and cured without the degradation that is observed when quantum dots are directly dispersed into epoxy.

EXAMPLES

Example 1

Various Active Layer Locations in Device

Figure 5:
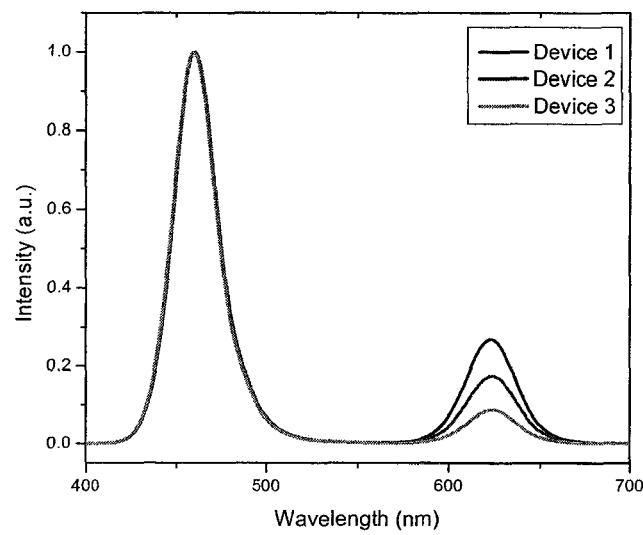
FIG. 5 is a spectral graph for solid state lighting devices according to embodiments of the present invention illustrating the relationship between the light source-active layer distance and the intensity of the light emitted by the device.

FIG. 5 illustrates the relationship between the distance between the light source and the active layer and the intensity of the light emitted by a solid state lighting device according to an embodiment of the present invention. In this example, three solid state lighting devices were fabricated with reference to the solid state lighting device illustrated in FIG. 4, the devices having different volumes of the second matrix material forming the first encapsulant layers (50) deposited on the active layers (30), thereby providing different distances between the active layers (30) and the light sources (20).

Here, the devices were fabricated on low power SMD-type LED chips, such as those LED chips produced by Knowledge-On Inc. The Knowledge-On LED chip has the form factors with 2.4 mm in diameter and about 1 mm in depth and surrounded by a white plastic cup. OP-54 (Dymax), a UV curable polyurethane acrylate, was used as the second matrix material (51) forming the first encapsulant layers (50) of each device. To form the first encapsulant layers (50), three different amounts of OP-54 were first deposited on the LED chips of the three devices in respective volumes of 0.0, 1.4, and 2.1 μl, where each 1 μl can make thickness in the range of 0.1-1 mm, which is dependant on the LED chip size, type and form factors. The OP-54 was then cured under ultraviolet radiation to form the first encapsulant layers.

To prepare the active layer (30) of each device, red light emitting CdSe quantum dot complexes were dispersed in a mixture of OP-54 (the first matrix material) and 20% methyl hexahydrophthalic anhydride (MHHPA), with a quantum dot complex concentration of 10 mg/ml. The same amount of OP-54 containing CdSe quantum dot complexes was disposed on the first encapsulant layers (50) for all three devices and cured under ultraviolet radiation to form the active layers (30).

To form the second encapsulant layers (60), the same volume 1.2 μl of OP-54 (the third matrix material (61)) was deposited on the active layers (30) of the three devices to form a dome shape and cured under ultraviolet radiation. This resulted in the three solid state lighting devices.

The intensity of the light emitted by the three devices was tested as follows. All devices were operated at 20 mA with voltage about 3.2V and quantum dot emissions measured. FIG. 5 shows the emission peak for the LED chip at around 460 nm and the emission peak for the quantum dots at around 625 nm. In the figure, the relative intensity of the light emitted by the quantum dots decreased with increased active layer distance from the LED chip. As demonstrated here, the active layer absorbs more photons from the light source when the active layer is closer to the light source.

Example 2

Green Light-Emitting Quantum Dots with Blue Light Source

Figure 6:
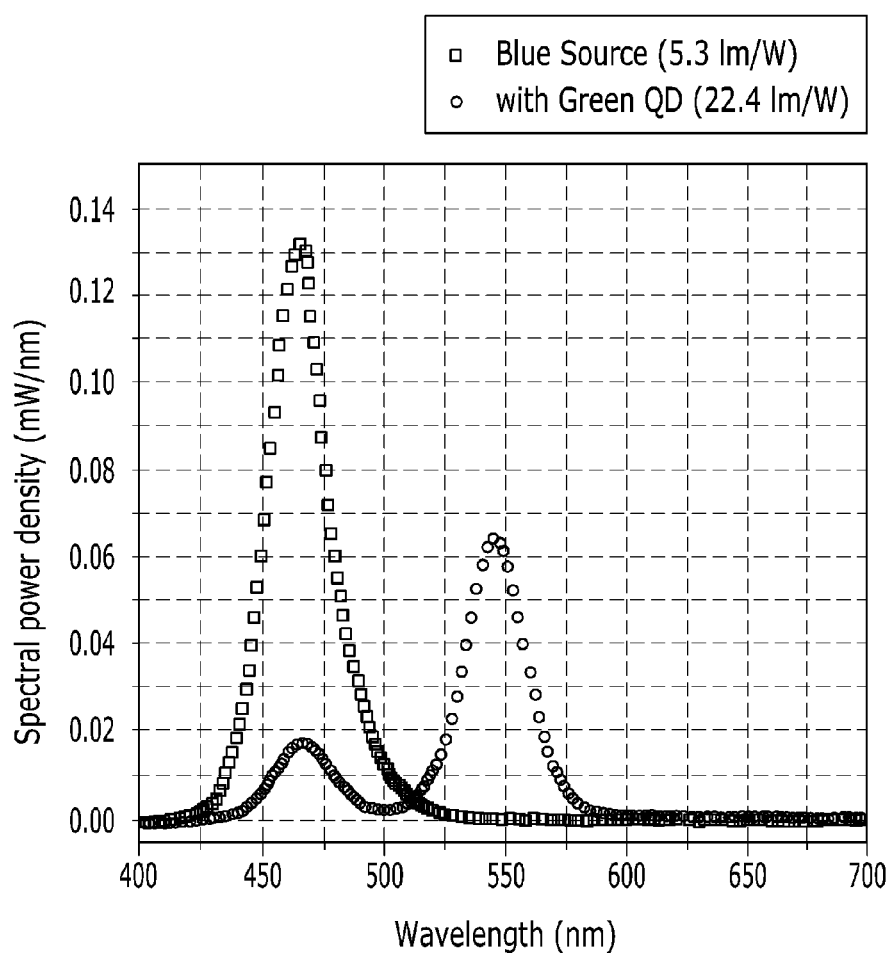
FIG. 6 is a spectral graph for a solid state lighting device according to an embodiment of the present invention when emitting green light and having a blue light source.

FIG. 6 illustrates the spectral response of a solid state lighting device according to an embodiment of the present invention when emitting green light from the quantum dots and having a blue light source. In this example, a green LED was fabricated with reference to the device of FIG. 4. A UV-curable silicone matrix material was used for the active layer (30), the first encapsulant layer (50), and the second encapsulant layer (60). The delivered volumes of matrix material for the layers were 2.0, 1.5, and 8 μl, respectively. To form the active layer, a mixture of 20% methyl hexahydrophthalic anhydride (MHHPA) and 80% silicone matrix material was embedded with 10 mg/ml of CdSe quantum dots. The spectral power density of the green LED was then measured.

Quantum yield is defined as a fraction of the number of quantum dot complex photons coming out of the number of absorbed photons, which is measured with very dilute concentration of quantum dots (~0.01 mg/ml) in an organic solvent. Conversion efficiency is also defined as the quantum yield with realistic concentration of quantum dots (>0.1 mg/ml) in the active layer when placed on the solid-state source. In this example, the quantum yield of the green LED was measured at about 74% and the conversion efficiency was measured at about 71%.

Typically, the efficiency significantly decreases by between 10 and 30% when the high concentration quantum dots are solvated in a matrix material and placed on an LED chip. However, as shown above, such was not the case with the green LED, where the conversion efficiency was very close to the original quantum yield without efficiency loss, even for the very high concentration 10 mg/ml. Thus, the LED of this example provides for a solid-state lighting device in which the conversion efficiency is substantially maintained upon the introduction of quantum dot complexes into the first matrix material. Preferably, the conversion efficiency after incorporation into the first matrix material is 80% of the efficiency of the underlying quantum dot complexes, more preferably 90%, and most preferably 95%.

As shown in FIG. 6, the green LED of the present example was found to have a very high efficacy 22.4 lm/W compared to the blue source LED chip efficacy 5.3 lm/W. The reasons for the high efficacy of the green LED was the high quantum dot conversion efficiency of the active layer and high human eye sensitivity to green. Inherently, traditional semiconductor LEDs cannot achieve high efficiency in the green to orange region (540-590 nm), where the efficiency of these LEDs has been on the order of 4-9 lm/W. For the green to orange color region, more than 60% conversion efficiency of the LED is viable in the LED light industry.

Example 3

White Light-Emitting Quantum Dots with Blue Light Source

Figure 7:
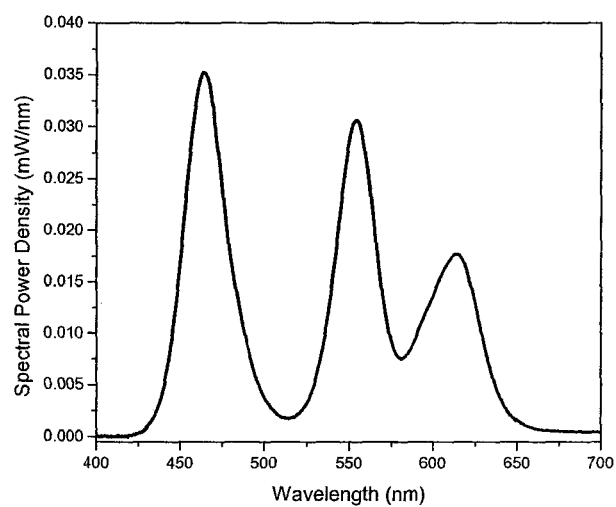
FIG. 7 is a spectral graph for a solid state lighting device according to an embodiment of the present invention when emitting white light and having a blue light source.

FIG. 7 illustrates the spectral response of a solid state lighting device according to an embodiment of the present invention when emitting white light from quantum dots and having a blue light source. Here, a white LED was fabricated with reference to the device of FIG. 4. A UV curable resin OP-54 was used for the active layer (30), the first encapsulant layer (50) and the second encapsulant layer (60). For the active layer (30), two CdSe quantum dot complexes, green and red light-emitting quantum dots, were mixed in toluene solvent with concentrations of 10 mg/ml for green and 1.3 mg/ml for red light-emitting quantum dot complex. 0.45 μl of the quantum dot solution in toluene was directly delivered on a first matrix material (35) of the active layer (30) without solvating the quantum dots in the first matrix material (35). After deposition of the active layer (30) on the first encapsulant layer (50), the device was dried in a vacuum oven to evaporate the organic solvent. The drying time is about 1 hour at 70 degrees Celsius. Then, the second encapsulant layer (60) was formed and UV-cured on top of the active layer (30). The emissions of the resulting white LED was measured.

As shown in FIG. 7, the blue light source emitted at a wavelength of about 460 nm, the green quantum dots emitted at about 555 nm, and the red quantum dots emitted at about 615 nm. The resulting white light corresponds to color coordinates (0.32, 0.32) of CIE 1931. The white LED performed at 15 lm/W in efficacy, 47% in quantum dot conversion efficiency, 6100 K in correlated color temperature, and 88 in color rendering index.

Example 4

Infrared Emitting Quantum Dots with Blue Light Source

Figure 8:
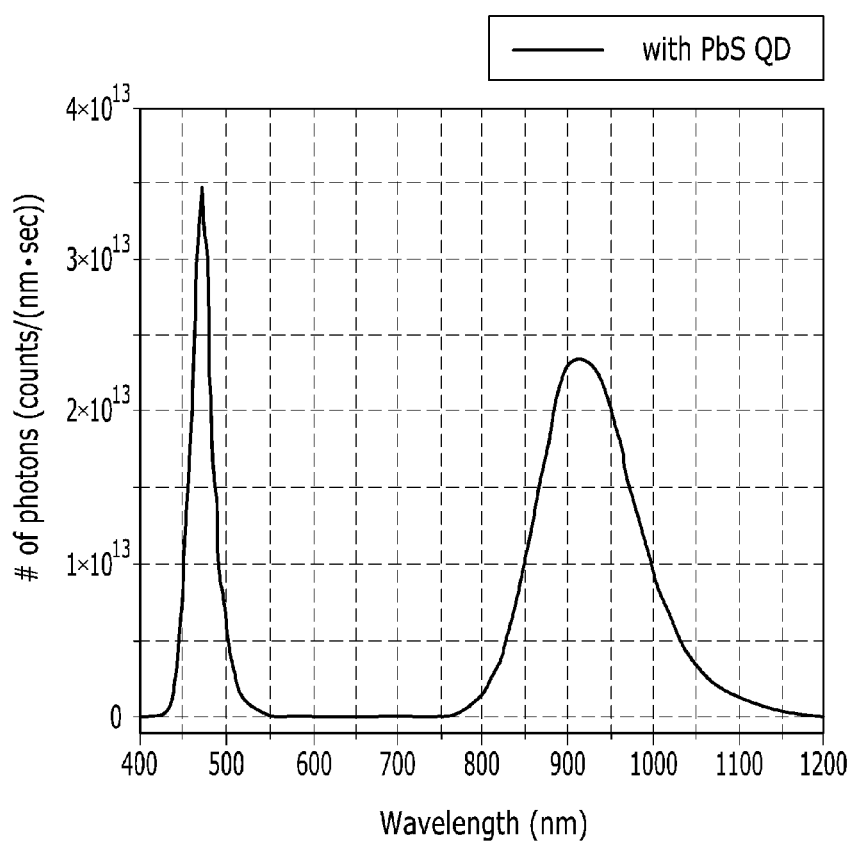
FIG. 8 is a spectral graph for a solid state lighting device according to an embodiment of the present invention when emitting infrared light and having a blue light source.

FIG. 8 shows the spectral response of a solid state lighting device according to an embodiment of the present invention when emitting infrared (IR) light from quantum dots and having a blue light source. In this example, an IR emitting LED was fabricated with reference to the device of FIG. 4. The active layer (30) was formed by solvating the concentration 10 mg/ml of PbS quantum dots in a mixture of 20% MHHPA and 80% silicone. The PbS quantum dot active layer (30) was placed between two encapsulant layers (50 and 60). Each encapsulant layer was silicone. The delivered volumes of the active (30), first encapsulant (50), and second encapsulant (60) layers were 2.0, 1.5, and 8 μl, respectively.

As shown in FIG. 8, the blue band is the remnant source emission, which was not absorbed by the quantum dots. The PbS quantum dots' emission band is located at 910 nm with a very broad spectrum. The conversion efficiency of the PbS quantum dot device was measured to be 82%.

Example 5

Multiple Active Layers with Red and Green Quantum Dots

Figure 9:
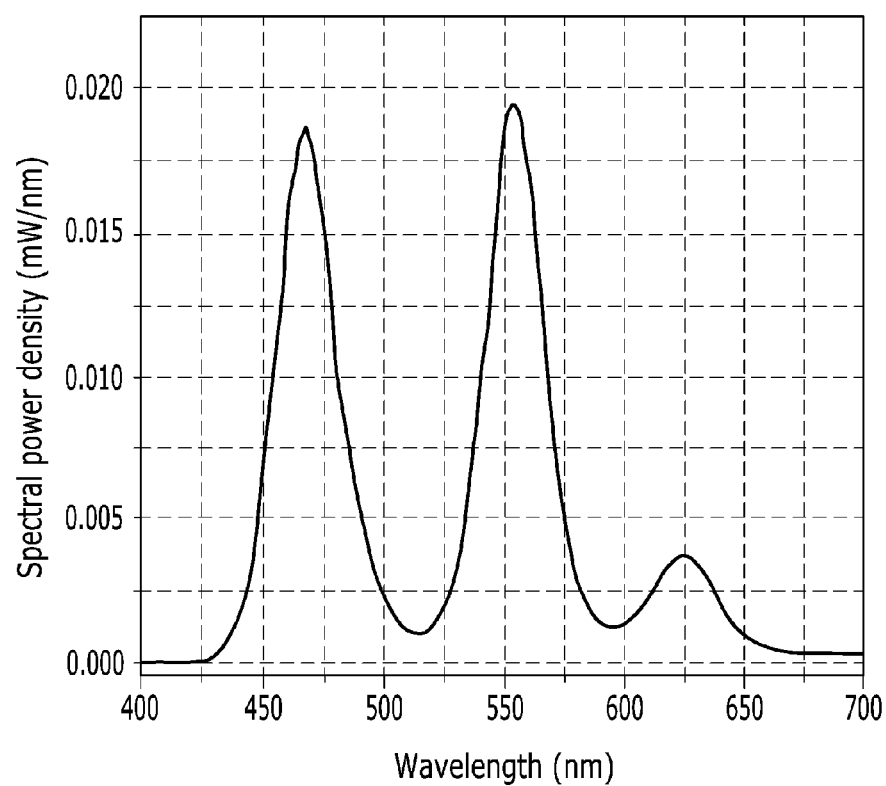
FIG. 9 is a spectral graph for a solid state lighting device according to an embodiment of the present invention when emitting red and yellow light from multiple active layers and having a blue light source.

FIG. 9 illustrates the spectral response of a solid state lighting device according to an embodiment of the present invention when emitting red and yellow light from multiple active layers. In this example, the multiple active layer device was fabricated as described in Example 1. The first encapsulant layer (50) and the second encapsulant layer (60) were the same as in Example 1, but instead of a single active layer, there were two active layers. The first active layer comprised red light-emitting quantum dots and the second active layer comprised green light-emitting quantum dots. Specifically, 0.3 μl of 2.5 mg/ml red quantum dots in OP-54 were deposited on the first encapsulant layer (50) and cured under UV irradiation. On top of the red quantum dot layer, 0.5 μl of OP-54 spacer film was made to space apart the active layers. Then, 0.5 μl of green emitting quantum dots (20 mg/ml in toluene solvent) was deposited on the spacer layer. To remove the remnant solvent in the second active layer, the deposited material was dried in a vacuum oven at 80 degrees Celsius for 1 hour.

As shown in FIG. 9, the blue light source emitted at a wavelength of about 460 nm, the green quantum dots emitted at about 555 nm, and the red quantum dots emitted at about 625 nm. Each emission band and intensity can be adjusted by concentration and volume of the red and green emitting quantum dots.

Example 6

Device Stability

One problem associated with the use of quantum dot complexes as a phosphor is that such devices typically degrade quickly over time. Embodiments of the present invention overcome this drawback through the use of structured layers and the use of an encapsulant layer (typically urethane acrylate) that reduces oxygen permeability.

In this example, a solid state lighting device was fabricated as described in Example 1. Cree 1411 SMD blue LED chips emitting at 460 nm were used as the light source. The structures and materials for the encapsulant and active layers were the same as in Example 1. The active layer was formed by doping the first matrix material with green and red emitting quantum dots at concentrations of 6.8 and 1.7 mg/ml, respectively, to produce a "warm" (T~3000K) white light. In another device, the doping for a "cooler" white (T~6000K) was 4.5 and 0.5 mg/ml for green and red, respectively. 1.7 µl of a second matrix material (51) was deposited on the blue LED chips and cured by UV irradiation for 20 seconds to form the first encapsulant layer (50). Volumes of 1-1.7 µl of the doped first matrix material (35) were then deposited on the first encapsulant layer (50) and cured for 60 seconds to form the active layer (30). 1.7 µl of a third matrix material (61) was then deposited on the active layer (30) and cured for 20 seconds to form the second encapsulant layer (60).

Figure 10:
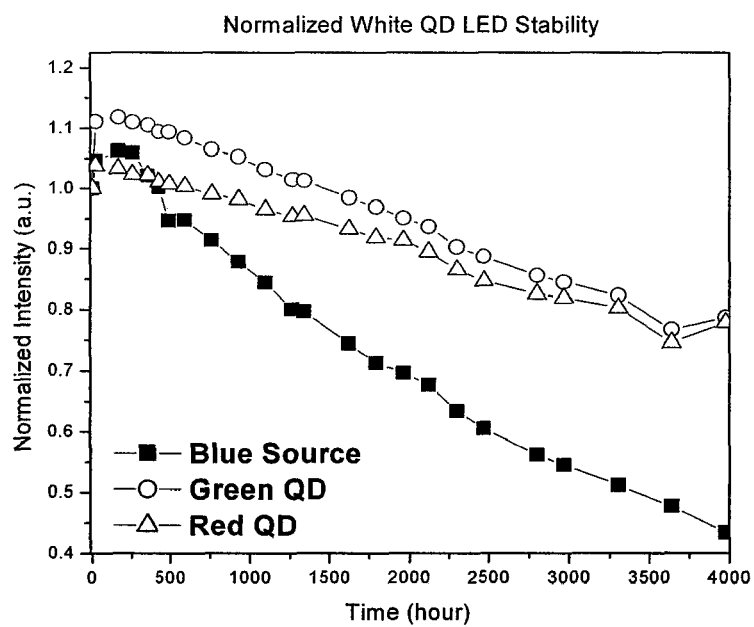
FIG. 10 is a spectral graph for a solid state lighting device according to an embodiment of the present invention illustrating the stability of a white LED monitored for 4000 hours.

Device intensities were tested over time and under a continuous DC current of 30 mA. The stability of the resulting white LEDs was monitored for 4000 hours, as shown in FIG. 10. The degradation rate of the underlying blue light source at 4000 hours was approximately 0.014%/hour; whereas, the degradation rates of the quantum dots were 0.0096%/hour for the green quantum dots and 0.0075%/hour for the red quantum dots.

Example 7

One Layered Device with Lamp-type Light Source

A solid state lighting device according to an embodiment of the present invention was fabricated having one layer. A lamp-type LED chip, such as supplied by Optosupply, was used as the light source, with emissions at about 460 nm. The small cup size of the lamp-type LED chip made it desirable to deposit a single layer thereon. In this example, 0.26 µL of OP-54 with quantum dots dispersed therein was deposited on the LED chip and cured by UV irradiation for 30 seconds. The device was then immersed in a 5 mm epoxy filled cap mold and heated at 110 Celsius for 8 hours.

Example 8

Scattering Elements to Improve Color Uniformity

In some conventional light emitting devices, e.g., lamp and surface mounted device (SMD) types, the light source and the quantum dot emissions are not uniform, such that the color observed changes depending on the viewing angle. The present invention solves this problem by adding non-absorbing light scattering dielectric particles.

Figure 11:
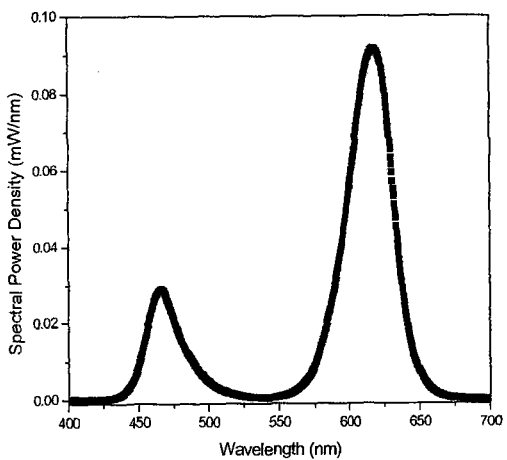
FIG. 11 is a spectral graph for a solid state lighting device according to an embodiment of the present invention when emitting red light.

In this example, an SMD was fabricated as follows. In the active layer, titania ($TiO_2$) nanoparticles, averaging 5 nm in diameter, were added at an optimal 1% by weight amount to OP-54 (the first matrix material) dispersed with red emitting quantum dots. Titania was not added to the two encapsulant layers of OP-54. As a result, the angular uniformity of the color emitted by the solid state lighting device improved greatly. The spectrum of the emitted light is shown in FIG. 11.

A lamp-type device was also fabricated as described in Example 7. The lamp-type device comprised one layer of quantum dots, matrix material, and titania. The device was cured under UV radiation and then encapsulated in epoxy as described in Example 7.

Example 9

Red Light-Emitting Quantum Dots with Green Light Source

In the previous examples, the underlying light source was a blue light source. In this example, a green light source was used. A green 1411 SMD LED chip, such as supplied by Optosupply, with emissions at about 525 nm was used as the light source. Red emitting quantum dots with emissions at about 602 nm were used in the active layer.

Four solid state lighting devices were fabricated as follows. A first device was fabricated of the green light source itself with UV-cured matrix material on it. The second, third, and fourth devices were fabricated according to embodiments of the present invention. The second, third, and fourth devices had three layers, in which the first and second encapsulant layers were formed of OP-54 and the active layers were formed of 1.75, 5.25, and 10.5 micrograms, respectively, with red emitting quantum dots dispersed in OP-54. The emitted colors were measured.

Figure 12:
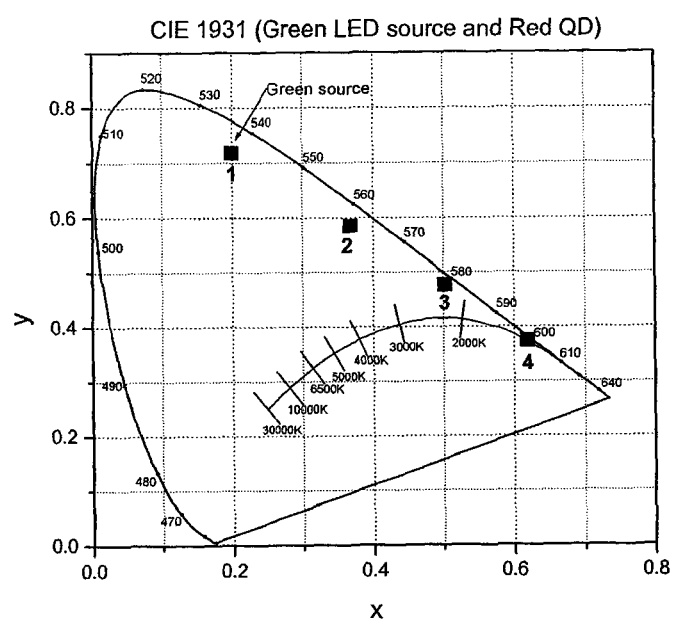
FIG. 12 is a CIE diagram showing the measured coordinates of the emitted colors for solid state lighting devices according to embodiments of the present invention having a green light source.

FIG. 12 shows the measured coordinates of the emitted colors for the four devices on the CIE 1931 diagram. The results show an increase in the area of the CIE 1931 diagram that is accessible with an increase in the amounts of quantum dots in the device.

Example 10

Quantum Dots with UV Light Source

Colors that are observed from a light emitting device having a blue light source are typically a mixture of the colors emitted by the quantum dots and the blue light source, unless enough quantum dots are dispersed in the active layer to saturate the color. However, while saturation is one way to produce a solid state lighting device in which only the color emitted by the quantum dots is observed, the efficiency of the device may be lowered somewhat due to reabsorption effects of the quantum dots. An alternative to saturation provided by the solid state lighting device of the present invention is to use an ultraviolet light source.

In this example, an ultraviolet LED chip, having emission at about 407 nm and of a 1411 SMD type, was used as the light source. Green, yellow, and red emitting quantum dots, having emissions at about, 536, 567, and 602 nm, respectively, were used in the active layers.

Four solid state lighting devices were fabricated as follows. A first device was fabricated of the UV light source itself with UV-cured matrix material on it. The second, third, and fourth devices were fabricated according to embodiments of the present invention. The second, third, and fourth devices had three layers, in which the first and second encapsulant layers were formed of OP-54 and the active layers were formed of quantum dots dispersed in OP-54. The second device had 10 micrograms of green emitting quantum dots in the active layer. The third device had 7 micrograms of yellow emitting quantum dots in the active layer. The fourth device had 3.5 micrograms of red quantum dots in the active layer. The emitted colors were measured.

Figure 13:
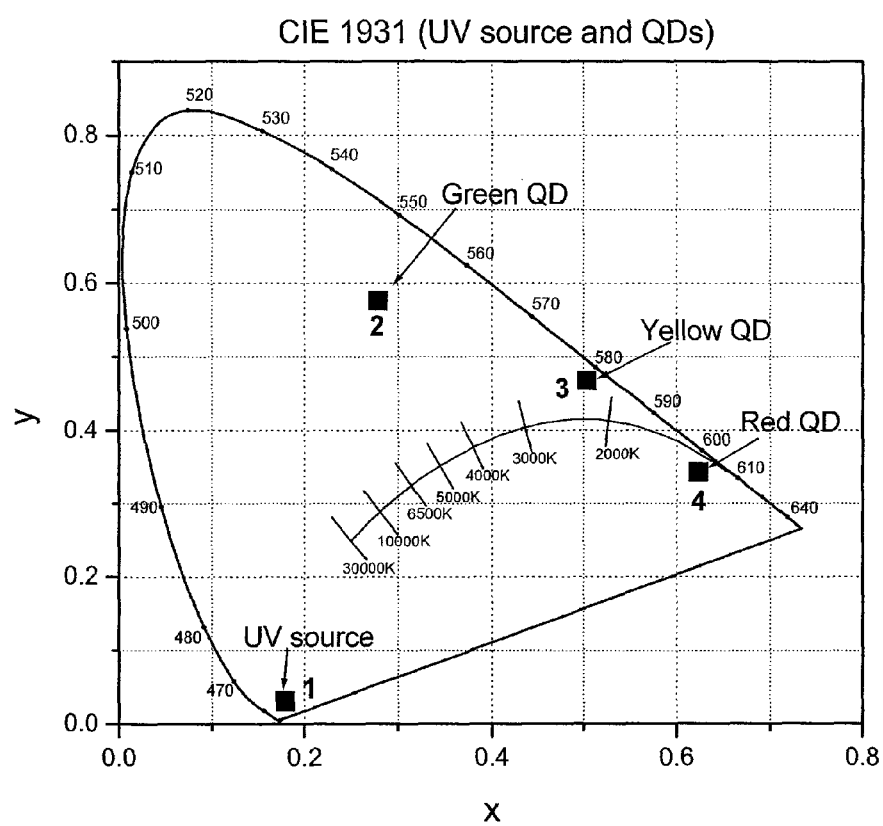
FIG. 13 is a CIE diagram showing the measured coordinates of the emitted colors for solid state light devices according to embodiments of the present invention having an ultraviolet light source.

FIG. 13 shows the measured coordinates of the emitted colors for the four devices on the CIE 1931 diagram. Using an ultraviolet LED chip provided two advantages. First, the quantum dots had higher absorption coefficients in the UV range, i.e., they absorb more of the UV light. Second, the ultraviolet light source contributed very little to the actual color of the device, such that less quantum dots were required to get the true color emitted by the quantum dots.

Example 11

Thermally Cured Red Light-Emitting Device

Figure 14:
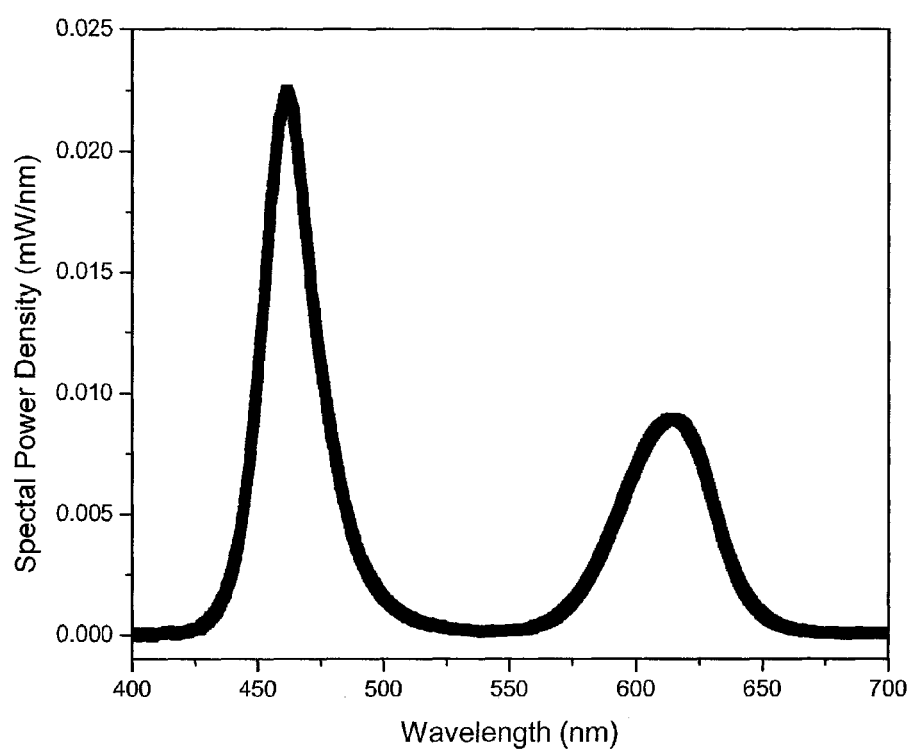
FIG. 14 is a spectral graph for a solid state lighting device according to embodiments of the present invention when emitting red light and having been thermally cured.

FIG. 14 shows a spectral response of a solid state lighting device of the present invention that was thermally cured. In this example, a thermally cured lamp-type LED was constructed using mixtures of epoxy and OP-54. To prepare the active layer, OP-54 was dispersed with red emitting quantum dots, having emission at about 602 nm, and mixed with epoxy in a ratio of 1:6, OP-54: epoxy by volume, resulting in a quantum dot concentration of about 1.43 mg/ml. The resulting mixture was deposited on an LED chip at a volume of 0.5 µl and then thermally cured for 30 minutes at 120 degrees Celsius. After cooling, a 5 mm epoxy cap was added as described in Example 7. The spectral response was then measured.

Example 12

Thermally Cured Warm White Light-Emitting Device

A thermal curing process was also used to construct a solid state lighting device according to an embodiment of the present invention that emits warm white light, having a correlated color temperature (CCT) of about 3000K and a high color rendering index (CRI) of about 94. An underlying chip, a Cree 1411 SMD with an emission peak at about 460 nm, was used as the light source. Red emitting quantum dots, having emission at about 610 nm, in conjunction with cesium yttrium aluminum garnet powder (Ce:YAG) from Osram were used in the active layer.

Figure 15:
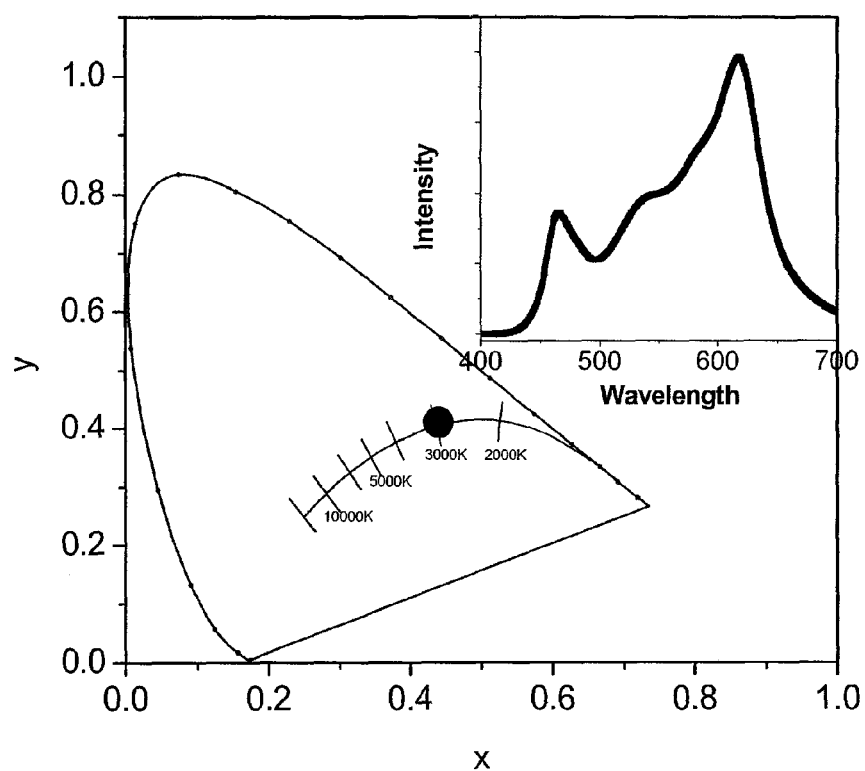
FIG. 15 is a spectral graph for a solid state lighting device according to an embodiment of the present invention when emitting warm white light and having been thermally cured.

To prepare the active layer, OP-54 was dispersed with the red emitting quantum dots and the Ce:YAG powder and mixed with epoxy in a ratio of 1:10, OP-54:epoxy, resulting in a quantum dot concentration of about 0.45 mg/ml and a Ce:YAG concentration of about 200 mg/ml. A 1.5 µl layer of epoxy was deposited on the chip and cured at 120 degrees Celsius for one hour. A 1.5 µl of the active layer was deposited on top of the epoxy layer and cured for one hour at 120 degrees Celsius. The spectrum of the resulting warm white, high CRI LED is shown in FIG. 15.

The foregoing description and examples have been set forth merely to illustrate the invention and are not intended as being limiting. Each of the disclosed aspects and embodiments of the present invention may be considered individually or in combination with other aspects, embodiments, and variations of the invention. Further, while certain features of embodiments of the present invention may be shown in only certain figures, such features can be incorporated into other embodiments shown in other figures while remaining within the scope of the present invention. In addition, unless otherwise specified, none of the steps of the methods of the present invention are confined to any particular order of performance. Modifications of the disclosed embodiments incorporating the spirit and substance of the invention may occur to persons skilled in the art and such modifications are within the scope of the present invention. Moreover, it is appreciated, that although a number of problems and deficiencies may be identified herein, each embodiment may not solve each problem identified in the prior art. Additionally, to the extent a problem identified in the prior art or an advantage of the present invention is cured, solved, or lessened by the claimed invention, the solution to such problems or the advantage identified should not be read into the claimed invention. Furthermore, all references cited herein are incorporated by reference in their entirety.

What is claimed is:

1. A solid state lighting device comprising:
   a light source; and
   an active layer deposited either directly or indirectly on top of the light source, the active layer comprising one or more populations of quantum dots dispersed in a first matrix material, wherein the first matrix material comprises a polymer or silicone having a plurality of cross-linked acrylate groups and the polymer or silicone having a plurality of cross-linked acrylate groups comprises a urethane acrylate, acrylated silicone, urethane acrylate epoxy mixture, or a combination thereof.

2. The device of claim 1, wherein the first matrix material comprises methyl hexahydrophthalic anhydride.

3. The device of claim 1, further comprising:
   an encapsulant layer deposited on top of the light source, the encapsulant layer comprising a second matrix material, and
   the active layer deposited on top of the encapsulant layer.

4. The device of claim 3, wherein the second matrix material comprises a polyacrylate, acrylated silicone, urethane acrylate, epoxy, silicone, sol-gel, nanoclay, or a combination thereof.

5. The device of claim 1, further comprising an encapsulant layer deposited on top of the active layer, the encapsulant layer comprising a second matrix material.

6. The device of claim 3, further comprising another encapsulant layer deposited on top of the active layer, the another encapsulant layer comprising a third matrix material.

7. The device of claim 5, wherein the third matrix material comprises a polyacrylate, acrylated silicone, urethane acrylate, epoxy, silicone, sol-gel, nanoclay, or a combination thereof.

8. The device of claim 1, wherein the active layer comprises a composite comprising micronized quantum dot complexes dispersed in the first matrix material, the micronized quantum dot complexes comprising the one or more populations of quantum dots dispersed in a base material, wherein the base material is micronized.

9. The device of claim 1, wherein the light source is a light emitting diode chip, a laser, a white light, a lamp, or any suitable combination thereof.

10. The device of claim 1, wherein the solid state lighting device is a light emitting diode.

11. The device of claim 1, wherein the solid state lighting device is a laser diode.

12. The device of claim 1, further comprising a reflector cup housing the light source.

13. A method of manufacturing a solid state lighting device comprising:
   providing a light source;
   dispersing quantum dots in a polymer or silicone having acrylate groups to form a first matrix material;
   depositing the first matrix material either directly or indirectly on top of the light source; and cross-linking the acrylate groups in the first matrix material to form a solid active layer,
wherein the first matrix material comprises a polymer or silicone having a plurality of cross-linked acrylate groups and the polymer or silicone having a plurality of cross-linked acrylate groups comprises a urethane acrylate, acrylated silicone, urethane acrylate epoxy mixture, or a combination thereof.

14. The method of claim 13, wherein the quantum dots are dispersed in the polymer or silicone without a solvent.

15. The method of claim 13, wherein depositing a first matrix material either directly or indirectly on top of the light source comprises:
   depositing an encapsulant layer on top the light source, the encapsulant layer comprising a second matrix material; and
   depositing the first matrix material on top of the encapsulant layer.

16. The method of claim 13, wherein cross-linking the acrylate groups comprises exposing the first matrix material to ultraviolet irradiation.

17. The method of claim 16, wherein a curing dosage of the ultraviolet irradiation is 0.6 J/cm$^2$.

18. The method of claim 13, wherein cross-linking the acrylate groups comprises:
   adding a thermal or an ultraviolet initiator to the first matrix material; and
   applying heat or ultraviolet irradiation to the first matrix material to cross-link the acrylate groups.

19. The method of claim 18, wherein the thermal initiator is azobisisobutyronitrile.

20. The method of claim 18, wherein the ultraviolet initiator is 1 hydroxy cyclohexyl phenyl ketone.

21. The method of claim 13, wherein cross-linking the acrylate groups comprises:
   adding a chemical additive to the first matrix material to cross-link the acrylate groups.

22. The method of claim 21, wherein the chemical additive is an amine, diamine, oleyl amine, docecyl amine, aminopropylmethoxysilane, bis(3-aminopropyl)-tetramethyl disiloxane, 3-aminopropyl dimethyl ethoxysilane, 3-aminopropylmethyl bis-(trimethyl siloxy)silane, or a combination thereof.

23. The method of claim 13, wherein the acrylate groups are cross-linked via an ultraviolet or thermal initiated vinylic addition, Michael addition or condensation.

24. The method of claim 13, further comprising:
   adding 20% methyl hexahydrophthalic anhydride to the first matrix material.

25. The method of claim 13, further comprising:
   adding an epoxy to the first matrix material.

26. A solid state lighting device comprising:
   a light source; and
   an active layer deposited either directly or indirectly on the light source, the active layer comprising:
   a first matrix material, wherein the first matrix material comprises a polymer or silicone having a plurality of cross-linked acrylate groups and the polymer or silicone having a plurality of cross-linked acrylate groups comprises a urethane acrylate, acrylated silicone, urethane acrylate epoxy mixture, or a combination thereof;
   a population of quantum dots dispersed in the first matrix material; and
   non-absorbing light scattering dielectric particles dispersed in the first matrix material, wherein the particles have a diameter between 2 nanometers and 50 microns, have refractive indices greater than that of the first matrix material, and are substantially non-absorbent to light emitted by the light source or the population of quantum dots.

27. The device of claim 26, wherein the non-absorbing light scattering dielectric particles comprise titania or alumina particles.

28. The device of claim 26, wherein the concentration of the non-absorbing light scattering dielectric particles in the first matrix material is 0.1%-20%.

29. The device of claim 26, further comprising a transparent lens cap overcoating the active layer either directly or indirectly.

30. A solid state lighting device comprising:
   a light source;
   a first active layer deposited either directly or indirectly on top of the light source, the first active layer comprising a first population of quantum dots dispersed in a first matrix material, wherein the first matrix material comprises a polymer or silicone having a plurality of cross-linked acrylate groups and the polymer or silicone having a plurality of cross-linked acrylate groups comprises a urethane acrylate, acrylated silicone, urethane acrylate epoxy mixture, or a combination thereof; and
   a second active layer deposited either directly or indirectly on top of the first active layer, the second active layer comprising a second population of different quantum dots.

31. The solid state lighting device of claim 30, further comprising:
   an encapsulant layer deposited on top of the light source, the encapsulant layer comprising a second matrix material, and
   the first active layer deposited on top of the encapsulant layer.

32. The device of claim 31, further comprising another encapsulant layer deposited on top of the second active layer, the another encapsulant layer comprising a third matrix material.

33. The device of claim 30, wherein the first population of quantum dots is dispersed in a first matrix material and the second population of different quantum dots is not dispersed in a matrix material.

34. The device of claim 30, wherein a spacer film is disposed between the first and second active layers.

* * * * *